United States Patent [19]

Negishi

[11] Patent Number: 4,802,179
[45] Date of Patent: Jan. 31, 1989

[54] APPARATUS FOR CONTROLLING OPTICAL OUTPUT FROM SEMICONDUCTOR LASER

[75] Inventor: Kiyoshi Negishi, Tokyo, Japan

[73] Assignee: Asahi Kogaku Kogyo Kabushiki Kaisha, Tokyo, Japan

[21] Appl. No.: 178,943

[22] Filed: Apr. 7, 1988

[30] Foreign Application Priority Data

Apr. 7, 1987 [JP] Japan .................... 62-85472

[51] Int. Cl.$^4$ .............................. H01S 3/00
[52] U.S. Cl. ......................... 372/38; 372/31
[58] Field of Search ................. 372/29, 31, 38

[56] References Cited

U.S. PATENT DOCUMENTS

| | | | |
|---|---|---|---|
| 4,611,352 | 9/1986 | Fujito et al. ................ | 372/31 |
| 4,663,760 | 5/1987 | Shimata et al. ............. | 372/31 |
| 4,734,914 | 3/1988 | Yoshikawa ................. | 372/31 |
| 4,745,609 | 5/1988 | Yoshikawa ................. | 372/31 |

FOREIGN PATENT DOCUMENTS

| | | | |
|---|---|---|---|
| 58-39130 | 3/1983 | Japan ........................... | 372/31 |
| 169180 | 9/1985 | Japan ........................... | 372/31 |

Primary Examiner—William L. Sikes
Assistant Examiner—Robert E. Wise
Attorney, Agent, or Firm—Sughrue, Mion, Zinn, Macpeak & Seas

[57] ABSTRACT

An apparatus for controlling an optical output from a semiconductor laser for use in a laser printer, designed to complete the emission intensity control in a short time and to prevent deterioration and thermorunaway even when a noise occurs, while enabling confirmation of whether or not the emission intensity control is completed without any abnormality. The intensity of emission from the semiconductor laser is compared with a reference value, and a current supplied to the semiconductor laser is changed in certain regular cycles is responce to the result of comparison. Strobe signals are supplied in, for instance, the same cycles and the results of comparison are successively stored in a storage device of more than two bits by the timing corresponding to the strobe signals. An APC completion signal is output when the stored results of comparison exhibit successive inversions and when the current detection value is lower than the reference value. The current changing operation is terminated before a new strobe signal is supplied.

6 Claims, 2 Drawing Sheets

APPARATUS FOR CONTROLLING OPTICAL OUTPUT FROM SEMICONDUCTOR LASER

BACKGROUND OF THE INVENTION (1) Field of the Invention

This invention relates to an apparatus for use in a laser printer adapted to control a semiconductor laser so as to make this laser emit a constant optical output.

(2) Description of the Prior Art

The intensity of emission from a laser diode relative to a current supplied thereto is highly temperature dependent. For this reason, in a laser printer, APC (automatic power control) is performed each time printing of, for example, one page is completed.

A circuit adapted for this control detects the intensity of emission from the laser diode by means of an optical detector, compares a detection value thereby obtained with a reference value by mean of a comparator, and increases or decreases the current supplied to the semiconductor laser in response to the result of this comparison. This operation is continued for a certain period of time (determined by considering that the control can provide desired effects within this period of time), and the control is thereafter terminated.

However, there is a possibility of occurrence of an error in the result of comparison because of influence on the comparing operation due to noise caused when charge is effected on a sensitive drum in a corona discharge manner. There is therefore a possibility of the emssion intensity control being terminated if the intensity of emission is deviated from a reference value, resulting in deterioration or thermorunaway of the semiconductor laser.

The emission intensity control cannot not be terminated in a short time, and the operation of the printer cannot be changed over speedily to the next printing process.

In addition, it is not possible to confirm whether or not the emission intensity control is completed without any abnormality.

SUMMARY OF THE INVENTION

In consideration of these problems, it is an object of the present invention to provide an apparatus for controlling an optical output from a semiconductor laser which is unsusceptible to noise, which can complete the emission intensity control in a short time while preventing deterioration or thermorunaway of the semiconductor laser, and which can confirm whether or not the emission intensity control is completed without any abnormality.

To this end, the present invention provides an apparatus for controlling an optical output from a semiconductor laser, the apparatus having a semiconductor laser, an optical detector for detecting the intensity of emission from the semiconductor laser, a comparison means for comparing a detection value supplied from the optical detector with a reference value, and a control means for increasing or decreasing in certain regular cycles a current supplied to the semiconductor laser in response to the result of comparison performed by the comparison means so that the detection value becomes equal to the reference value, the apparatus being characterized by including: a timing generation means for outputting strobe signals in the above cycles; an APC completion signal discrimination means successively storing the result of comparison by the timing corresponding to the strobe signals by means of a storage device of more than two bits, the APC completion discrimination means outputting an APC completion signal when the stored result of comparison exhibits successive inversions and when the current detection value is lower than the reference value; and a control termination means for terminating the increasing or decreasing operation by receiving the APC completion signal, before a new strobe signal is supplied.

The duration time of each strobe signal is extremely short compared with the above cycle. Therefore, there is substantially no possibility of occurrence of an error in the result of comparison due to influence of noise when each strobe signal is supplied. Even if a noise occurs by corona discharge or other phenomena, the intensity of emission can be made approximately equal to the reference value without being influenced by the noise.

Since the increasing or decreasing operation is terminated when the intensity of emission is lower than the reference value, deterioration or thermorunaway of the semiconductor laser due to a change in the ambient temperature can be prevented.

The emission intensity control can be completed in a short time, and it is possible to immediately start the succeeding printing operation.

In addition, it is possible to ascertain whether or not the emission intensity control is completed by reading the APC completion signal.

DESCRIPTION OF THE PREFERRED EMBODIMENT

Figure 1:
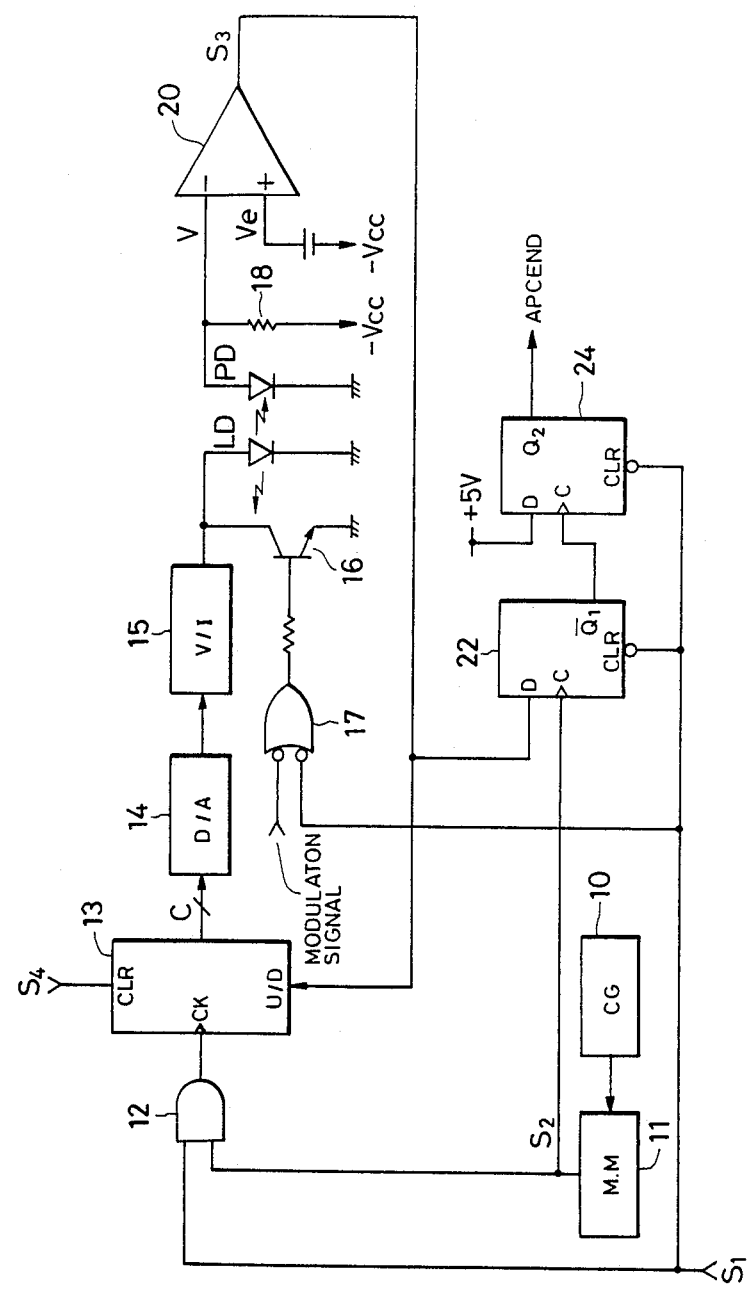
FIG. 1 is a diagram of a circuit for controlling the intensity of emission from a laser diode in accordance with an embodiment of the present invention.

An embodiment of the present invention will be described below with reference to the accompanying drawings. FIG. 1 shows an optical output control circuit for a semiconductor device.

Figure 2:
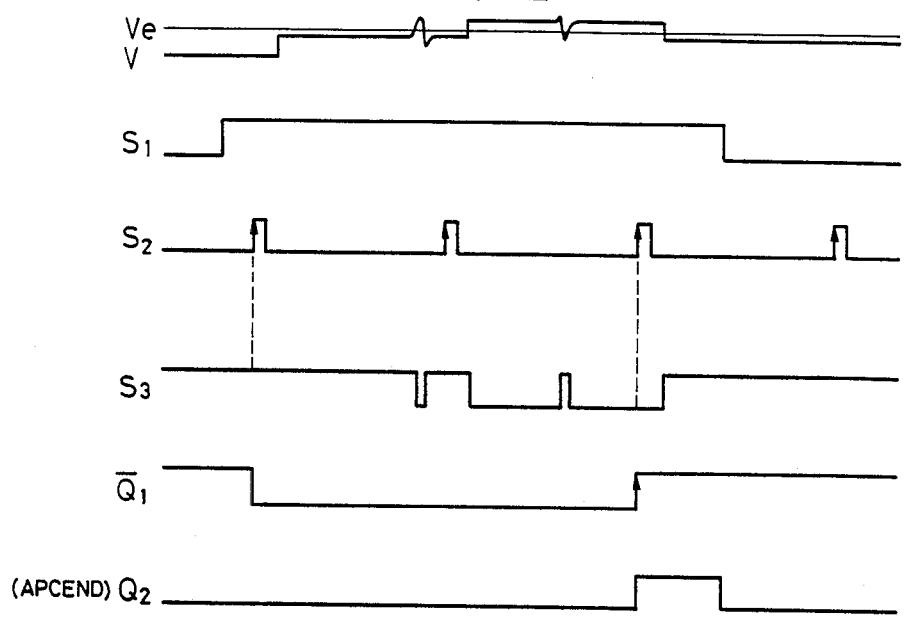
FIGS. 2 and 3 are timing charts of essential signals flowing through the circuit shown in FIG. 1.

Clock pulses output from a clock generator circuit 10 are supplied to a mono-multi-vibrator 11, and clock pulses $S_2$ such as those shown in FIG. 2 are produced and supplied to one of two input terminals of the AND gate 12. The other input terminal of the AND gate 12 is supplied with an APC control signal $S_1$ output from a host microcomputer (not shown). The clock pulses $S_2$ are supplied to a clock input terminal CK of a counter 13 via the AND gate 12 and are counted therein while the APC control signal $S_1$ is high level. A count value C output from the counter 13 is supplied to a D/A converter 14 and is thereby converted into an analog value. It is then supplied to a V/I converter 15 and is thereby converted into a current value. The output terminal of the V/I converter 15 is connected to the anode of a laser diode LD and to the collector of an NPN transistor 16. The cathode of the laser diode LD and the emitter of the NPN transistor 16 are grounded. The base of the NPN transistor 16 is supplied with a modulation signal which is output from the host microcomputer via an OR gate 17. The other input terminal of the OR gate 17 is supplied with the APC control signal $S_1$. During APC, that is, during a period of time when the APC control signal $S_1$ is high level, the base voltage of the NPN transistor 16 is low level while the modulation signal is high level, thereby allowing a current in proportion to the count value C to be supplied from the V/I converter 14 to the laser diode LD. Laser light emitted from the laser diode LD is introduced through an optical system (not shown) to perform main scanning.

A PIN photodiode PD is disposed near the laser diode LD and is used to detect the intensity of emission from the laser diode LD. The cathode of the PIN photodiode is grounded, and the anode is connected to a terminal $-V_{cc}$ of a power source via a resistor 18 and to an inverting input terminal of a comparator 20. Therefore, a voltage V which corresponds to the intensity of emission is applied to the inverting input terminal of the comparator 20. Therefore, a voltage V which corresponds to the intensity of emission is applied to the inverting input terminal of the comparator 20. A reference voltage Ve is applied to the non-inverting input terminal of the comparator 20. If the intensity of emission from the laser diode LD exceeds the reference value, a comparison signal $S_3$ which is output from the comparator 20 becomes low level.

The comparison signal $S_3$ is supplied to an up-down control terminal U/D of the counter 13 and to an input terminal D of a D flip flop 22 which is provided as a memory device. Clock pulses $S_2$ used as strobe signals are supplied from the mono-multi-vibrator 11 to a clock input terminal C of the D flip flop 22 with a period of, e.g., 1 msec. The D flip flop 22 stores the voltage level of the comparison signal $S_3$ by the timing corresponding to a positive edge of each clock pulse $S_2$. An output $\overline{Q}_1$ issued from the D flip flop 22 is supplied to an input terminal C of a D flip flop 24. The input terminal D of the D flip flop 24 is constantly maintained at a high level. The D flip flop 24 detects and stores positive edges of the signal supplied through the clock terminal C. An APC completion signal (APCEND) is supplied from an output terminal $Q_2$ of the D flip flop 24 to the host microcomputer. When the host microcomputer receives the APC completion signal, it makes the APC control signal $S_1$ low level within the period of supply of the clock pulse $S_2$, for example, 0.04 msec after (refer to FIG. 2), and thereafter starts to print the next page.

The APC control signal $S_1$ is supplied to clear terminals CLR of the D flip flops 22 and 24. When the APC control signal $S_1$ is low level, the output $\overline{Q}_1$ from the D flip flop 22 is high level while the output $Q_2$ from the D flip flop 24 is low level.

Next, the operation of this embodiment will be described below.

When the power source is activated, a reset signal $S_4$ is supplied to a clear terminal CLR of the counter 13, thereby clearing the count value so as to protect the laser diode DL.

First, the operation will be described with reference to FIG. 2 with respect to a case in which the APC is started, that is, the APC control signal $S_1$ is set to the high level when the intensity of emission from the laser diode LD is lower than the set value, that is, the comparison signal $S_3$ is high level.

When the positive edge of one of the clock pulses $S_2$ is supplied to the input terminal C of the D flip flop 22, The output $\overline{Q}_1$ of the D flip flop 22 is inverted from the high level to the low level since the comparison signal $S_3$ is high level. On the other hand, the clock pulse $S_2$ is also supplied to the input terminal CK of the counter 13 via the AND gate 12. Since the input terminal U/D has been high level, the counter 13 is in a count-up mode, and the count value C is incremented. The intensity of emission from the laser diode LD is thereby increased, and the voltage V of the inverting input terminal of the comparator 20 is increased by one degree.

The voltage V is lower than the reference voltage Ve but is close thereto. Therefore, the comparison signal $S_3$ can be inverted comparatively easily under the influence of noise caused by corona discharge in the electrifying section or other operations.

However, the level of the comparison signal $S_3$ is stored by the D flip flop 22 by the timing corresponding to the positive edge of the clock pulse $S_2$. Therefore, the flip flop 22 does not store any incorrect levels so long as it is not influenced by such a noise at the moment when the positive edge of the clock pulse $S_2$ is supplied.

The duration time of each positive edge relative to the period of supply of the clock pulses $S_2$ is extremely short, and the possibility of the comparison signal $S_3$ becoming an incorrect signal due to mixing of a noise when a positive edge is supplied is extremely low. Thus, there is substantially no influence of noise on the level of the comparison signal $S_3$ stored in the flip flop 22.

The count value C of the counter 13 is further incremented by the positive edge of a succeeding clock pulse $S_2$, the intensity of emission from the laser diode LD is increased, and the comparison signal $S_3$ is inverted from the high level to the low level.

The output $\overline{Q}_1$ from the D flip flop 22 is inverted to the high level by the positive edge of another succeeding clock pulse $S_2$, and the positive edge of this inverted output is supplied to the input terminal C of the D flip flop 24 so that the output $Q_2$ from the D flip flop 24 becomes high level. That is, an APC completion signal is output. Since the comparison signal $S_3$ is low level, the counter 13 is in a count-down mode. The count value of the counter 13 is decremented by the positive edge of the clock pulse $S_2$, the intensity of emission from the laser diode LD becomes lower than the set value, and the comparison signal $S_3$ is inverted to the high level.

When the host microcomputer receives this APC completion signal, it sets the APC control signal $S_1$ to the low level within the period of supply of the clock pulses $S_2$. The output $Q_2$ from the D flip flop 24 becomes low level. At the same time, the AND gate 12 is closed so that the count value C of the counter 13 is maintained.

Therefore, the APC is terminated when the intensity of emission from the laser diode LD becomes substantially equal to and lower than the set value. In other words, the control of the laser diode LD is terminated on the safety side. Deterioration or breakage of the laser diode LD due to thermorunaway is thereby prevented.

Figure 3:
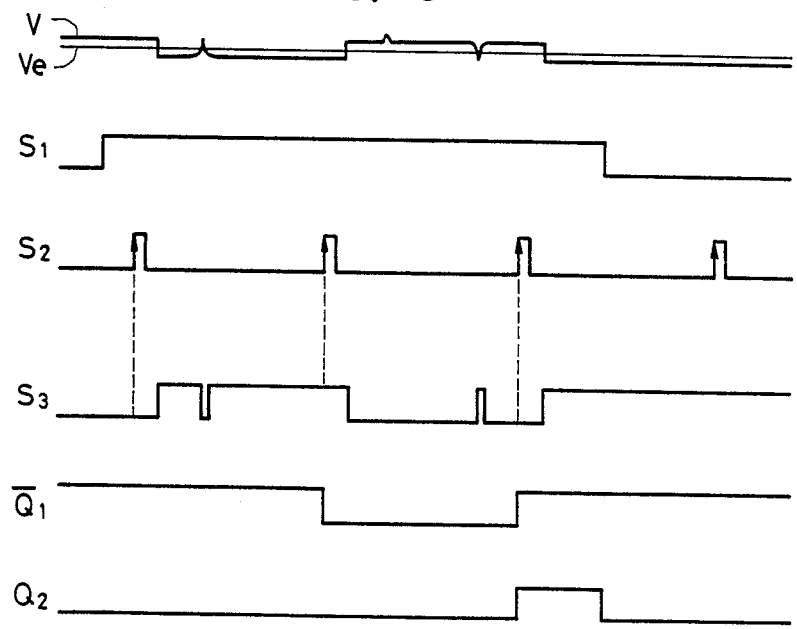

Next, the operation will be described with reference to FIG. 3 with respect to a case in which the intensity of emission from the laser diode LD is higher than the set value because of a change in the ambient temperature when the APC control signal $S_1$ is set to the high level for printing of the next page after the printing of one page has been completed.

The comparison signal $S_3$ is low level, and the output $\overline{Q}_1$ from the flip flop 22 is still high level even if the positive edge of the clock pulse $S_2$ is supplied to the input terminal C of the D flip flop 22. At this time, the counter 13 is in the count-down mode. The count value of the counter 13 is decremented by the clock pulse $S_2$, thereby reducing the intensity of emission from the laser diode LD. If this intensity decreases below the set value, the comparison signal $S_3$ is inverted to the high level.

Therefore, the output $\bar{Q}_1$ from the D flip flop 22 is inverted to the low level by the positive edge of a succeeding clock pulse $S_2$. Since the counter 13 is in the count-up mode, the count value C of the counter 13 is incremented by this clock pulse $S_1$. The intensity of emission from the laser diode LD. thereby increases over the set value, and the comparison signal $S_3$ is inverted to the low level.

When the positive edge of another succeeding clock pulse $S_2$ is supplied to the input terminal C of the D flip flop 22, the output $\bar{Q}_1$ is inverted to the high level, and the positive edge of the inverted output is detected by the D flip flop 24 so that the output $Q_2$ from the D flip flop 24 becomes high level. On the other hand, the counter 13 is changed to the count-down mode, and the count value thereof is decremented. The intensity of emission from the laser diode LD thereby decreases below the set value, and the comparison signal $S_3$ is inverted to the high level.

The succeeding operation is performed in the same manner as in the case of FIG. 2.

In the above-described embodiment, the apparatus makes use of only one D flip flop 22 for storing the level of the comparison signal $S_3$, but it may be provided with two or more flip flops of this type. It is of course possible to use a JK flip flop instead of the D flip flop.

The clock generator 10, mono-multi-vibrator 11, AND gate 12, counter 13, D flip flops 22 and 24 may be constitute a one-tip microcomputer while the D flip flops 22 and 24 are designed in correspondence with 1 bit of an incorporated RAM to be set or reset on the basis of a software.

In the apparatus for controlling the intensity of emission from the semiconductor laser in accordance with the present invention, the intensity of emission from the semiconductor laser is compared with a reference value, the current supplied to the semiconductor laser is periodically increased or decreased in response to the result of this comparison, strobe signals are supplied in correspondence with this operation of periodically increasing or decreasing the current, the results of comparison are stored in a storage device by the timing corresponding to the strobe signals, an APC completion signal is output when the results of comparison exhibit a plurality of inversions and when the intensity of emission is lower than the reference value, the increasing or decreasing operation is terminated before a new strobe signal is supplied. Since the duration time of each strobe signal is short, the possibility of occurrence of an error due to influence of noise when each strobe signal is supplied is very small, and the intensity of emission can be made approximately equal to the reference value without being influenced by a noise caused by corona discharge or other phenomena. The present invention further realizes the following advantages.

When the intensity of emission is lower than the reference value, the increasing or decreasing operation can be terminated without being influenced by such a noise. Therefore, deterioration and thermorunaway of the semiconductor laser due to a change in the ambient temperature can be prevented.

The emission intensity control can be completed in a short time, and it is possible to immediately start the succeeding printing operation.

It is possible to ascertain whether or not the emission intensity control is completed by reading the APC completion signal.

The apparatus in accordance with the present invention is simple in construction.

What is claimed is:

1. An apparatus for controlling an optical output from a semiconductor laser, having a semiconductor laser, an optical detector for detecting the intensity of emission from said semiconductor laser, comparison means for comparing a detection value supplied from said optical detector with a reference value, and control means for increasing or decreasing a current supplied to said semiconductor laser in response to the result of said comparison performed by said comparison means so that said detection value becomes equal to said reference value, said apparatus comprising:

timing generation means for outputting strobe signals in predetermined cycles;

APC completion signal discrimination means successively storing the result of said comparison by the timing corresponding to said strobe signals by means of a storage device of more than two bits, said APC completion discrimination means outputting an APC completion signal when said stored result of said comparison exhibits successive inversions and when the current detection value is lower than said reference value; and control termination means for terminating said increasing or decreasing operation by receiving said APC completion signal, before a new strobe signal is supplied.

2. An apparatus for controlling an optical output from a semiconductor laser according to claim 1, wherein said storage device includes a flip flop which stores the result of said comparison when one of said strobe signal is supplied to its clock input terminal.

3. An apparatus for controlling a optical output from a semiconductor laser according to claim 2, wherein said flip flop includes a D flip flop.

4. An apparatus for controlling an optical output from a semiconductor laser according to claim 3, wherein said APC completion discrimination means is constituted by a pair of first-stage and second-stage flip flops, and wherein an inverting output terminal of said first-stage flip flop is connected to a clock input terminal of said second-stage flip flop; a clock input terminal of said first-stage flip flop is supplied with said strobe signals; a data input terminal of said first-stage flip flop is supplied with the result of said comparison; a data input terminal of said second-stage flip flop is supplied with logical "1"; an non-inverting output from said second-stage flip flop is used as said APC completion signal; and said pair of flip flops are cleared by a signal used to terminate said increasing or decreasing operation.

5. An apparatus for controlling an optical output from a semiconductor laser according to claim 1, wherein said control means performs said increasing or decreasing operation by the timing corresponding to said strobe signals.

6. An apparatus for controlling an optical output from a semiconductor laser according to claim 5, wherein said control means is constituted by using a counter, and wherein an up/down control terminal of said counter is supplied with the result of said comparison; a clock terminal of said counter is supplied with said strobe signals; and a current in proportion to a count value from counter is supplied to said semiconductor laser.

* * * * *